(12) United States Patent  (10) Patent No.: US 6,313,521 B1
Baba  (45) Date of Patent: Nov. 6, 2001

(54) SEMICONDUCTOR DEVICE AND METHOD OF MANUFACTURING THE SAME

(75) Inventor: Mikio Baba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/433,112

(22) Filed: Nov. 3, 1999

(30) Foreign Application Priority Data

Nov. 4, 1998 (JP) .................................. 10-313389

(51) Int. Cl.[7] .......................... H01L 23/02; H01L 23/34; H01L 23/29
(52) U.S. Cl. .......................... 257/678; 257/659; 257/723; 257/790; 257/787
(58) Field of Search .................................. 257/678, 659, 257/723, 790, 787, 783, 704, 778, 693, 724; 438/107, 109, 110, 108, 118, 112, 124, 125, 126

(56) References Cited

U.S. PATENT DOCUMENTS 5,386,342 * 1/1995 Rostoker .............................. 361/749

FOREIGN PATENT DOCUMENTS

| 1-124249 | 5/1989 | (JP) . | |
|---|---|---|---|
| 2-22846 * | 1/1990 | (JP) | ...................................... 257/790 |
| 2-74058 * | 3/1990 | (JP) | ...................................... 257/790 |
| 2-90658 * | 3/1990 | (JP) | ...................................... 257/790 |
| 4-58551 | 2/1992 | (JP) . | |
| 4-111459 | 4/1992 | (JP) . | |
| 4-137756 | 5/1992 | (JP) . | |
| 6-13499 * | 1/1994 | (JP) | ...................................... 257/787 |
| 7-263618 | 10/1995 | (JP) . | |
| 9-248986 | 9/1997 | (JP) . | |
| 10-178043 | 6/1998 | (JP) . | |

* cited by examiner

*Primary Examiner*—Jhihan B Clark
(74) *Attorney, Agent, or Firm*—Hutchins, Wheeler & Dittmar

(57) ABSTRACT

A semiconductor device having one or more semiconductor chips and chip components and a manufacturing method. In the semiconductor device, electrical short of the chip components and the like can be effectively avoided, and break away of the chip components from a substrate can be avoided. The semiconductor device comprises: one or more semiconductor chips each of which is flip chip bonded at a first surface thereof to the substrate; at least one chip components mounted on the substrate and in the proximity of the semiconductor chips; insulating underfill resin which covers the chip components and which fills at least part of a portion between the first surface of each of the semiconductor chips and the substrate; and a lid member which is bonded to a second surface of each of the semiconductor devices opposite to the first surface, via conductive adhesive resin.

10 Claims, 9 Drawing Sheets

PRIOR ART

SEMICONDUCTOR DEVICE AND METHOD OF MANUFACTURING THE SAME

FIELD OF THE INVENTION

The present invention relates generally to a semiconductor device in which one or more semiconductor chips and chip components are mounted on a substrate and a method of manufacturing the semiconductor device. More particularly, the present invention relates to a semiconductor device in which one or more semiconductor chips and chip components are mounted on a substrate and in which electrical short and coming away of the chip components from the substrate are avoided, and a method of manufacturing such semiconductor device.

BACKGROUND OF THE INVENTION

FIG. 11 is a conceptual cross sectional view illustrating an example of a conventional semiconductor device. As shown in FIG. 11, a semiconductor chip 32 is flip chip bonded on a substrate 31 which has conductor patterns formed thereon not shown in the drawing. The semiconductor chip 32 is electrically coupled with the conductor patterns on the substrate 31 not shown in the drawing via eutectic solder portions 33. In the proximity of the semiconductor chip 32, chip components 34 such as chip capacitors, and the like are attached to the substrate 31 via the eutectic solder portions 35. The chip components 34 are electrically coupled with the conductor patterns on the substrate not shown in the drawing via the eutectic solder portions 35. Underfill resin 36 is injected between a first surface of the semiconductor chip 32, that is, a surface on which circuit elements are formed and which is a surface on the bottom side of the drawing sheet, and the substrate 31. The underfill resin 36 fills a space between the first surface of the semiconductor chip 32 and the substrate 31 except the eutectic solder portions 33 and is cured to strongly fix the semiconductor chip 32 to the substrate 31.

Usually, on the first surface of the semiconductor chip 32, there are provided high temperature solder bumps not shown in the drawing, and eutectic solder portions which have lower melting point than that of the high temperature solder bumps are disposed on the substrate 31 at locations corresponding to those of the solder bumps of the semiconductor chips 32. The high temperature solder bumps of the semiconductor chip 32 and the eutectic solder portions of the substrate 31 are aligned, and heated at a temperature in which the eutectic solder melts but the high temperature solder does not melt. Thereby, only the eutectic solder portions melt, and, thereafter, the eutectic solder portions are cured. By this process, the eutectic solder potions cure such that the eutectic solder portions swallow up the solder bumps. Also, on the surface of the substrate 31 opposite to the surface on which the semiconductor chip 32 and the chip components 34 are mounted, a plurality of solder balls 37 made of the eutectic solder are disposed. The semiconductor device 50 of FIG. 11 thereby constitutes a BGA (Ball Grid Array) package structure.

When the completed semiconductor device 50 is mounted on another substrate and the like, the solder balls 37 are once melted by heating and thereafter cured, thereby the semiconductor device 50 and another substrate and the like are electrically and mechanically coupled. However, when the solder balls 37 are melted by heating, the eutectic solder portions 33 coupling the semiconductor chip 32 and the substrate 31 are also melted once similarly to the solder balls 37, by the heat conducted via the substrate 31. Therefore, there is a possibility that mutual positional relation between the substrate 31 and the semiconductor chip 32 deviates from correct positional relation and that electrical and mechanical coupling between the substrate 31 and the semiconductor chip 32 becomes unstable. Thus, when the substrate 31 and the semiconductor chip 32 are coupled only by the eutectic solder 33, electrical and mechanical coupling become unreliable. In order to avoid such disadvantage, as shown in FIG. 11, the underfill resin 36 was injected and cured between the substrate 31 and the semiconductor chip 32, thereby securing the substrate 31 and the semiconductor chip 32 by the underfill resin 36. In this structure, the heating temperature for melting the solder ball 37 made of eutectic solder is determined to be a low temperature such that the eutectic solder melts but the underfill resin 36 does not deteriorate. Thereby, high reliability of electrical and mechanical coupling between the substrate 31 and the semiconductor chip 32 can be realized.

On a second surface of the semiconductor chip 32, that is a surface on the upper side of FIG. 11, an adhesive resin 38 which is electrically conductive is applied. By the adhesive resin 38, a lid member 39 is attached to the second surface of the semiconductor chip 32, wherein the lid member 39 is made of a metal and has good heat conductivity. The lid member 39 dissipates heat produced by the semiconductor chip 32 and functions to couple the semiconductor chip 32 to the ground potential, that is, functions to ground the semiconductor chip 32. Also, there is provided an electrically conductive auxiliary board 40 which surrounds a space containing the semiconductor chip 32 and the chip components 34. The auxiliary board 40 is also bonded to the substrate 31 and to the lid member 39 by using electrically conductive adhesive resin 41. Therefore, a space 42 including the semiconductor chip 32 and the chip components 34 is electromagnetically shielded by the lid member 39 and the auxiliary board 40.

In the fabrication of the above-mentioned conventional semiconductor device 50, when the lid member 39 is bonded to the second surface of the semiconductor chip 32 and the auxiliary board 40 by the conductive adhesive resin 38, if the quantity of the conductive adhesive resin 38 applied to the second surface of the semiconductor chip 32 is too large, there is a possibility that the conductive adhesive resin 38 also reach and contact the chip components 34. FIG. 12 is a cross sectional view illustrating a situation caused when the quantity of the conductive adhesive resin 38 is too large. In such situation, there is a possibility that electrical short occurs between terminals of one chip component, between terminals of a plurality of chip components, between a chip component 34 and the semiconductor chip 32, and so on, via the conductive adhesive resin 38. Therefore, it becomes impossible for the semiconductor device 50 to perform its inherent function. On the other hand, if the quantity of the adhesive resin 38 is too small, the lid member 39 and the semiconductor 32 are not secured strongly and stably. Therefore, in the manufacturing process of the conventional semiconductor device, it is necessary to apply the conductive adhesive resin 38 on the semiconductor chip 32, very carefully.

In the above-mentioned conventional semiconductor device 50, the chip components 34 are fixed on the substrate 31 only by the eutectic solder portions 35. Therefore, securing force between each of the chip components 34 and the substrate 31 is not sufficiently large and there is a possibility that the chip components 34 come away from the substrate 31. Especially, when the semiconductor device 50 is fixed to another substrate or another component by using the solder balls 37 disposed on the surface of the substrate 31 opposite to the surface on which the semiconductor chip 32 and the chip components 34 are coupled, there occurs a problem. That is, when the solder balls 37 are heated by solder reflow process to melt the solder balls 37, the eutectic solder portions 35 coupling the chip components 34 to the substrate 31 also melt, and the chip components 34 are apt to come away from the substrate 31. Therefore, in the conventional semiconductor device 50, the eutectic solder portions 35 for fixing the chip components 34 to the substrate 31 and the solder balls 37, which are also made of eutectic solder, melt almost simultaneously and, thus, there is a high possibility that the chip components 34 are not secured strongly to the substrate 31 when the solder balls 37 melt.

SUMMARY OF THE INVENTION

Therefore, it is an object of the present invention to obviate the above-mentioned disadvantages of the conventional semiconductor device.

It is another object of the present invention to provide a semiconductor device which comprises one or more semiconductor chips and chip components and in which electrical short within one chip component, among the chip components and among the chip components and the semiconductor chips and the like can be effectively avoided, and a method of manufacturing such semiconductor device.

It is still another object of the present invention to provide a semiconductor device which comprises one or more semiconductor chips and chip components and in which coming away of the chip components from a substrate can be avoided, and a method of manufacturing such semiconductor device.

According to an aspect of the present invention, there is provided a semiconductor device comprising: a substrate; one or more semiconductor chips each of which is flip chip bonded at a first surface thereof to said substrate; at least one chip components mounted on said substrate and in the proximity of the one or more semiconductor chips; insulating underfill resin which covers the chip components and which fills at least part of a portion between the first surface of each of the one or more semiconductor chips and the substrate; and a lid member which is bonded to a second surface of each of the one or more semiconductor chips opposite to the first surface, via conductive adhesive resin.

In this case, it is preferable that the one or more semiconductor chips and the at least one chip components are electrically coupled with conductor pattern portions of the substrate via solder coupling portions, wherein the one or more semiconductor chips are fixed to the substrate by the underfill resin which fills between the first surface of each of the one or more semiconductor chips and the substrate except the solder coupling portions, and wherein the chip components are fixed to the substrate by the underfill resin covering the chip components.

It is preferable that at least part of the second surface of each of the one or more semiconductor chips is electrically conductive.

It is also preferable that the semiconductor device further comprises an auxiliary board which intervenes between the substrate and the lid member.

It is further preferable that the auxiliary board surrounds a space including the one or more semiconductor chips and the chip components.

It is also advantageous that the lid member and the auxiliary board are both made of conductive material, that the auxiliary board is bonded to the lid member by conductive adhesive resin, and that the one or more semiconductor chips and the chip components are electromagnetically shielded by the lid member and the auxiliary board.

Further, it is preferable that the semiconductor device comprises a plurality of solder balls provided on a surface of the substrate opposite to the surface on which the one or more semiconductor chips and the chip components are mounted, and whereby the semiconductor device constitutes a BGA (Ball Grid Array) package structure.

Also, it is possible for the semiconductor device to further comprise: a mold resin portion which molds at least a part of the lid member, the substrate, the one or more semiconductor chips, the chip components and the underfill resin; and a lead frame which is fixed with the substrate, which is electrically coupled with conductor pattern portions of the substrate, and a part of which projects outside the mold resin portion.

It is also preferable that the semiconductor device comprises a plurality of pad terminals provided on a surface of the substrate opposite to a surface on which the one or more semiconductor chips and the chip components are mounted, and whereby the semiconductor device constitutes a LGA (Land Grid Array) package structure.

It is possible to use, as the lid member, a lid member with heat dissipating fins.

According to another aspect of the present invention, there is provided a method of manufacturing a semiconductor device comprising: mounting one or more semiconductor chips at a first surface thereof on a substrate by flip chip bonding; mounting at least one chip components on the substrate and in the proximity of the one or more semiconductor chips; injecting and curing insulating underfill resin such that the insulating underfill resin fills at least part of a portion between the first surface of each of the one or more semiconductor devices and the substrate and the insulating underfill resin covers the chip components; and bonding a lid member onto a second surface of each of the one or more semiconductor chips via conductive adhesive resin, the second surface is opposite to the first surface of the one or more semiconductor chips.

In this case, it is preferable that, in the mounting one or more semiconductor chips at a first surface thereof on a substrate, the first surface of each of the one or more semiconductor chips is electrically coupled with conductor pattern portions of the substrate via solder coupling portions, and, in the mounting at least one chip components on the substrate, the chip components are electrically coupled with conductor pattern portions of the substrate via solder coupling portions.

It is also preferable that the one or more semiconductor chips are fixed to the substrate by the underfill resin which fills between the first surface of each of the one or more semiconductor chips and the substrate except the solder coupling portions, and wherein the chip components are fixed to the substrate by the unserfill resin covering the chip components.

It is further preferable that at least a part of the second surface of each of the one or more semiconductor chips is conductive.

It is advantageous that the semiconductor device comprises an auxiliary board attached on the substrate, and the method further comprises applying adhesive resin on the upper surface of the auxiliary board, and wherein, in the bonding a lid member onto a second surface of the one or more semiconductor chips, the lid member is also bonded to the auxiliary board via the adhesive resin.

It is also advantageous that the one or more semiconductor chips and the chip components are mounted on the substrate in a region surrounded by the auxiliary board.

It is also preferable that the lid member, the auxiliary board and the adhesive resin bonding the lid member and the auxiliary board are made of electrically conductive materials.

It is preferable that the method further comprises: providing a plurality of solder balls on a surface of the substrate opposite to a surface of the substrate on which the one or more semiconductor chips and the chip components are mounted.

It is also preferable that the method further comprises: fixing a lead frame to the substrate; and molding a part of the lid member, a part of the lead frame, the substrate, the one or more semiconductor chips, the chip components and the underfill resin by using mold resin.

It is further preferable that a plurality of pad terminals are provided on a surface of the substrate opposite to a surface of the substrate on which the one or more semiconductor chips and the chip components are mounted.

It is also possible to use, as the lid member, a lid member with heat dissipating fins.

In the structures of the present invention mentioned above, the chip components are wholly covered with the insulating underfill resin and, therefore, it is possible to avoid electrical short between terminals of one chip component, between the chip components, between the chip component and the semiconductor chip, and so on via the conductive adhesive resin. Also, since the chip components are strongly fixed to the substrate by the insulating under fill resin, it is possible to avoid breakaway or coming away of the chip components in a reflow process and the like.

Further, since the above-mentioned semiconductor device uses an electrically conductive lid member and a conductive auxiliary board member, it is possible to electromagnetically shield the semiconductor chips and the chip components, and to suppress influence of electromagnetic wave from inside of the semiconductor device to outside thereof and vice versa.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

With reference to the drawings, embodiments of the present invention will now be explained.

Figure 1:
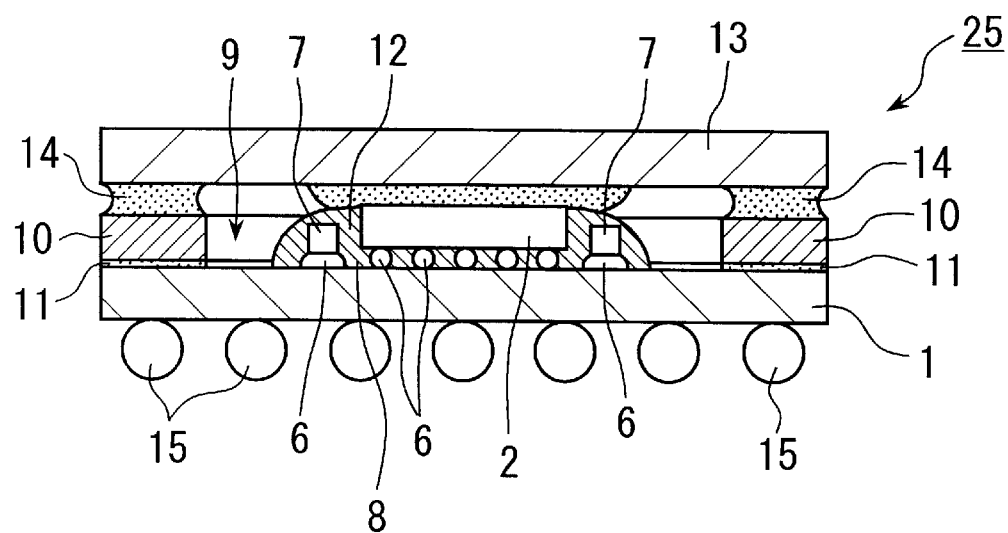
FIG. 1 is a cross sectional view illustrating a semiconductor device according to a first embodiment of the present invention.
Figure 2:
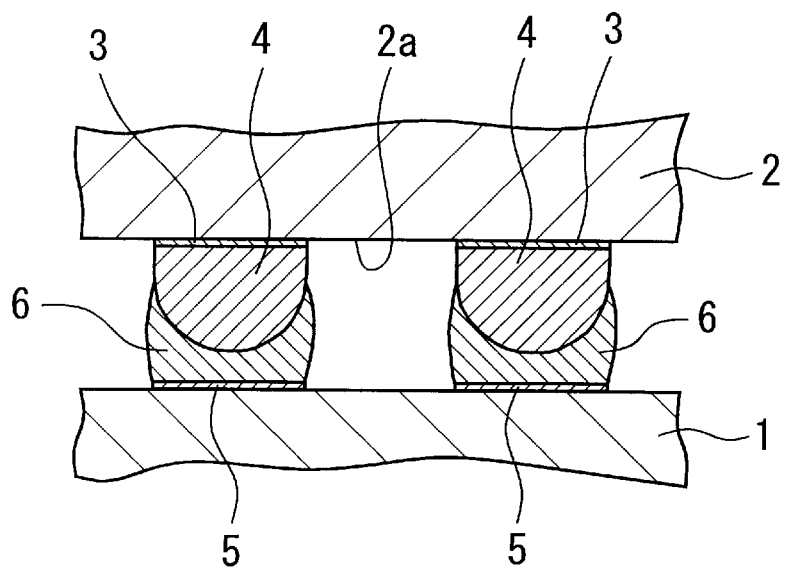
FIG. 2 is a partial enlarged cross sectional view illustrating a part of the semiconductor device shown in FIG. 1.
Figure 3:
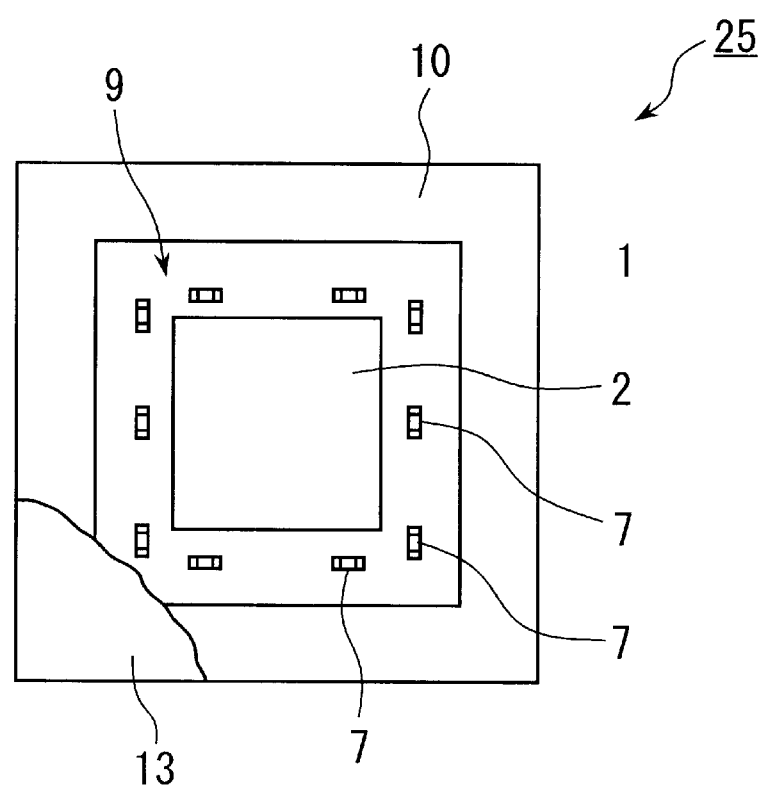
FIG. 3 is a partially cut away plan view illustrating the semiconductor device of FIG. 1, wherein a lid member, conductive adhesive resin and underfill resin are partially removed.

FIG. 1 illustrates conceptually a cross section of a semiconductor device according to a first embodiment of the present invention. FIG. 2 is a partial enlarged cross sectional view of a part of the semiconductor device shown in FIG. 1. FIG. 3 is a partially cut away plan view illustrating the semiconductor device of FIG. 1, wherein underfill resin is removed for the sake of easy understanding of positional relation of components.

First, a structure of the semiconductor device of the first embodiment will be explained. The semiconductor device comprises a substrate 1, for example, an organic substrate, on which conductor patterns not shown in FIG. 1 are formed. Of course, the substrate 1 may be any kind of substrate other than the organic substrate. A semiconductor chip 2, such as an LSI chip and the like, is flip chip bonded at a first surface thereof on the substrate 1. The first surface of the semiconductor chip 2 is a surface on the bottom side of the drawing sheet of FIG. 1.

As shown in detail in FIG. 2, on the first surface 2a of the semiconductor chip 2, there are provided metal pads 3 as connecting terminals. On the metal pads 3, there are formed solder bumps 4 made of high temperature solder which melts at, for example, approximately 340 degrees Celsius. On the other hand, metal pads 5 are provided on the substrate 1 at the locations corresponding to the solder bumps 4 on the side of the semiconductor chip 2. On the metal pads 5, there are formed eutectic solder portions 6 which melt at, for example, 220 degrees Celsius. The eutectic solder portions 6 is melted and cured such that the solder bumps 4 are wrapped with the eutectic solder portions 6. Thereby, the semiconductor chip 2 is fixed to the substrate 1, and the metal pads 3 of the semiconductor chip 2 are electrically coupled to the respective metal pads 5 of the substrate 1. Also, on the substrate 1 and in the proximity of the semiconductor chip 2, at least one chip components 7, such as chip resistors, chip capacitors and the like, are fixed by using eutectic solder 6. Electrodes of the chip components 7 are electrically coupled to the conductor patterns of the substrate 1 via the eutectic solder portions 6.

Insulator underfill resin 8, such as epoxy resin and the like, is injected into a portion between the substrate 1 and the semiconductor chip 2. The insulator underfill resin 8 fills a portion between the substrate 1 and the semiconductor chip 2 and other than coupling solder portions 4 and 6. The insulator underfill resin fills not only between the substrate 1 and the semiconductor chip 2, but also fills a portion around and on each of the chip components 7 so as to cover the chip components 7. Thereby, the chip components 7 are mechanically fixed to the substrate 1 strongly. That is, the underfill resin 8 covers a portion of the semiconductor chip 2 except a second surface thereof, i.e., a surface on the upper side of the drawing sheet of FIG. 1, and wholly covers the chip components 7.

On the substrate 1, there is attached an auxiliary board or a stiffener board 10 so as to surround a space 9 in which the semiconductor chip 2 and the chip components 7 are mounted. The auxiliary board 10 is made, for example, of copper (Cu) or copper coated with a nickel film as an anti-oxidation film, and is attached to the substrate 1 by conductive adhesive resin 11, such as silver paste and the like. It should be noted that material of each of the auxiliary board 10 and the conductive adhesive resin 11 may be any other material, if necessary.

On the second surface of the semiconductor chip 2, that is, the surface on the upper side of the drawing sheet of FIG. 1, a conductive lid member 13 is attached by conductive adhesive resin 12, such as silver paste and the like. The conductive lid member 13 is made, for example, of copper or copper coated with a nickel film as an anti-oxidation film. Also, the upper surface of the auxiliary board 10 is also bonded to the lid member 13 by using conductive adhesive resin 14, such as silver paste and the like. It should be noted that material of each of the lid member 13 and the conductive adhesive resin 12 and 14 may be any other material, if necessary. It should also be noted that materials of the conductive adhesive resin 11, 12 and 14 may be the same or may be mutually different.

On a surface of the substrate 1 opposite to the surface on which the semiconductor chip 2 and the chip components 7 are mounted, that is, a surface on the bottom side of the drawing sheet of FIG. 1, there are provided many solder balls 15 each comprising eutectic solder. Although not shown in the drawing, these solder balls 15 are connected to the conductor patterns, for example, the metal pads 5 of the substrate 1, via through holes and connecting patterns not shown in the drawings, and become connecting terminals of the semiconductor device of FIG. 1 which is connected to other components or other substrate.

In this embodiment, the semiconductor chip 2 has, for example, a square shape whose length of a side is, for example, approximately 13 mm. The space between the substrate 1 and the semiconductor chip 2 is, for example, approximately 150 micrometers ($\mu$m). A pitch of the solder bumps 4 is, for example, approximately 240 micrometers, and the number of the solder bumps 4 provided in one semiconductor chip 2 is, for example, approximately 3000.

The semiconductor device 25 of this embodiment has the structure mentioned above and, especially, the chip components 7 are wholly covered with the insulator underfill resin 8. Therefore, electrodes or terminals of the chip components 7 do not contact the conductive adhesive resin 12. Thus, electrical short does not occur, via the conductive adhesive resin 12, between electrodes of one chip component 7, between electrodes of a plurality of chip components 7, between electrodes of the chip components 7 and conductive portion of the semiconductor chip 2, and so on, so that the conductive adhesive resin 12 does not cause malfunction and the like of the semiconductor device. Also, the chip components 7 as well as the semiconductor chip 2 are coupled with the substrate 1 via eutectic solder portions 6 and are mechanically fixed to the substrate 1 by the underfill resin 8. Therefore, coming away or dislocation of the chip components 7 does not occur in a solder reflow process, and electrical and mechanical coupling of the chip components 7 to the substrate 1 can be attained reliably.

The second surface of the semiconductor chip 2, that is, the surface on the upper side of the drawing sheet of FIG. 1, is at least partially conductive, because an oxide film on the second surface is removed to expose silicon portion, or a metal film, i.e., a back metal portion, is formed thereon. Such second surface of the semiconductor chip 2 is coupled with the conductive lid member 13 via the conductive adhesive resin 12. The lid member 13 functions as a ground terminal for coupling to the ground potential. For example, when the semiconductor device 25 according to the present embodiment is mounted on any other substrate by using the solder balls 15, the lid member 13 is electrically coupled with a ground pattern on the other substrate via the conductive adhesive resin 14, the auxiliary board 10, the conductive adhesive resin 11, conductor pattern or patterns and through hole or through holes of the substrate 1 not shown in the drawing, and the solder ball 15. Also, it is possible to use insulating adhesive resin such as epoxy resin and the like in place of the conductive adhesive resin 11. In this case, it is possible to form through hole or through holes in the auxiliary board 10 and the insulating adhesive resin and to fill the through hole or through holes with the conductive adhesive resin 14, thereby electrically coupling the lid member 13 with the conductor pattern or patterns of the substrate 1 not shown in the drawing.

The space 9 including the semiconductor chip 2 and the chip components 7 is surrounded by the lid member 13, the auxiliary board 10 and the conductive adhesive resin 11 and 14, and thereby the semiconductor chip 2 and the chip components 7 are electromagnetically shielded. Therefore, electromagnetic wave generated during operation of the semiconductor chip does not escape outside the semiconductor device 25 and does not give bad influence on components and the like existing outside, and vice versa.

Next, brief explanation will be made on a method of manufacturing the above-mentioned semiconductor device 25.

FIGS. 4A through 4C and FIGS. 5A and 5B are cross sectional views each illustrating a cross sectional structure of a semiconductor device of the first embodiment obtained during a manufacturing process thereof.

Figure 4A:
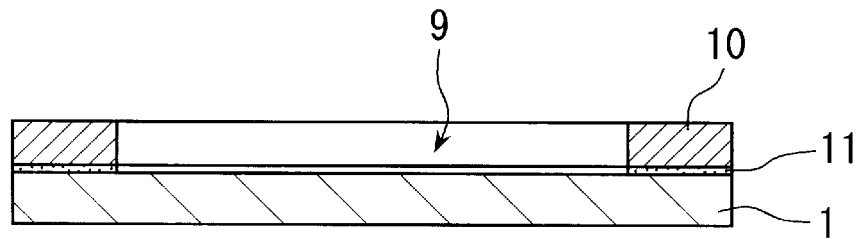
FIG. 4A, FIG. 4B and FIG. 4C are cross sectional views each illustrating a cross sectional structure of a semiconductor device of FIG. 1 obtained during a manufacturing process thereof.

First, as shown in FIG. 4A, a substrate 1 is prepared on which a rectangular or square shaped auxiliary board 10 having a large opening inside and having a predetermined size is attached by conductive adhesive resin 11.

Figure 4B:
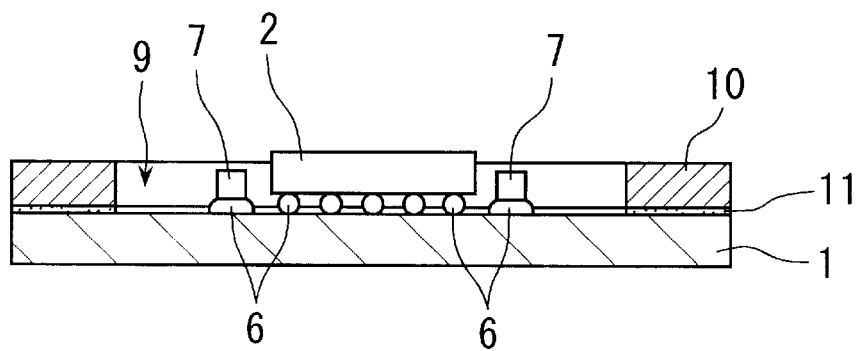

Then, as shown in FIG. 4B, a semiconductor chip 2 is flip chip bonded on the substrate 1 and within a space 9 surrounded by the auxiliary board 10. Also, one or more chip components 7 are mounted on the substrate 1 and within the space 9. Thereby, the semiconductor chip 2 and the chip components 7 are electrically and mechanically coupled with conductor patterns not shown in the drawing on the substrate 1 via eutectic solder portions 6.

Figure 4C:
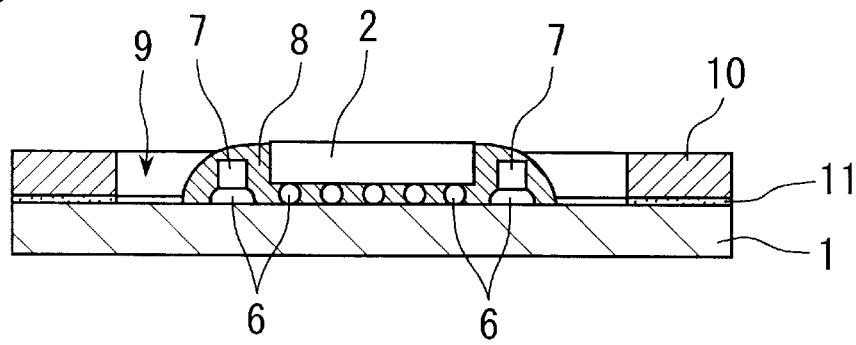

Next, as shown in FIG. 4C, underfill resin 8 is injected and applied such that the underfill resin 8 fills between the substrate 1 and the semiconductor chip 2 and such that the underfill resin 8 wholly covers the chip components 7.

Figure 5A:
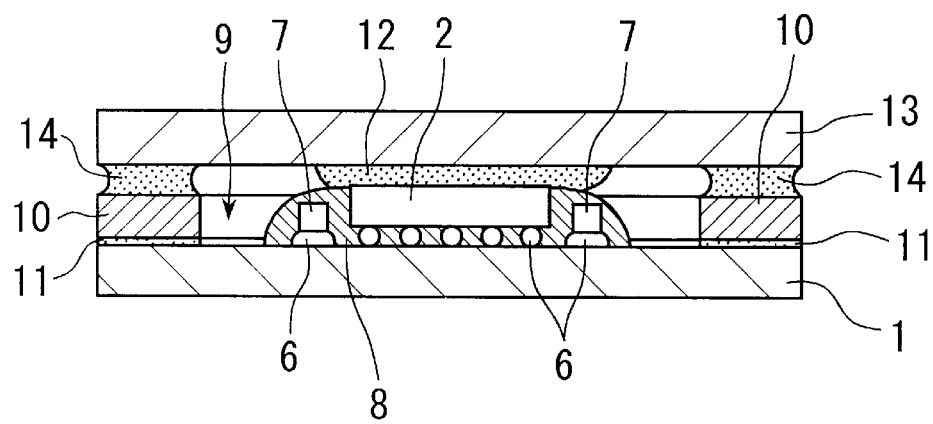
FIG. 5A and FIG. 5B are cross sectional views each illustrating a cross sectional structure of a semiconductor device of FIG. 1, obtained after the cross sectional structure of FIG. 4C, during a manufacturing process thereof.

As shown in FIG. 5A, conductive adhesive resin 12 is applied on the semiconductor chip 2, and conductive adhesive resin 14 is applied on the auxiliary board 10. By these conductive resins 12 and 14, the lid member 13 is attached to the semiconductor chip 2 and the auxiliary board 10. In this case, even if the quantity of the conductive adhesive resin 12 applied on the semiconductor chip 2 is somewhat too large, the conductive adhesive resin 12 does not contact the chip components 7 directly and does not give bad influence on the chip components 7 and so on, since the chip components 7 are covered with the underfill resin 8 which is an insulator.

Figure 5B:
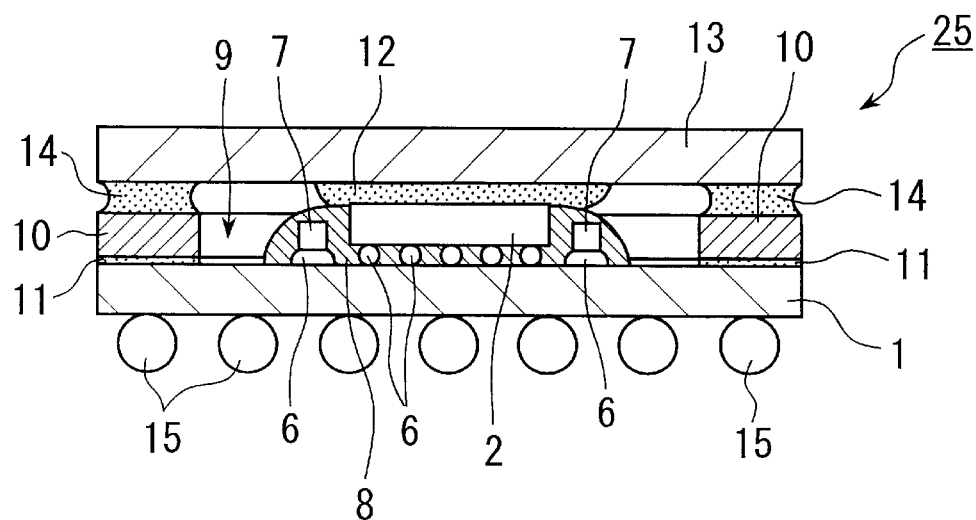

Lastly, on the surface of the substrate 1 opposite to the surface on which the semiconductor chip 2 and the chip components 7 are mounted, many solder balls 15 each comprising eutectic solder are attached. Thereby, the semiconductor device 25 having a BGA (Ball Grid Array) package structure is completed as shown in FIG. 5B.

When the semiconductor device 25 according to this embodiment is to be attached to an external substrate and the like, the solder balls 15 are used to electrically and mechanically couple the semiconductor device 25 to the external substrate and the like. Even if the eutectic solder portions 6 are melted in a reflow process to melt the solder balls 15, since the semiconductor chip 2 and the chip components 7 are fixed to the substrate 1 by the underfill resin 8, the semiconductor chip 2 and the chip components 7 are not dislocated and do not come away from the substrate 1.

Figure 6:
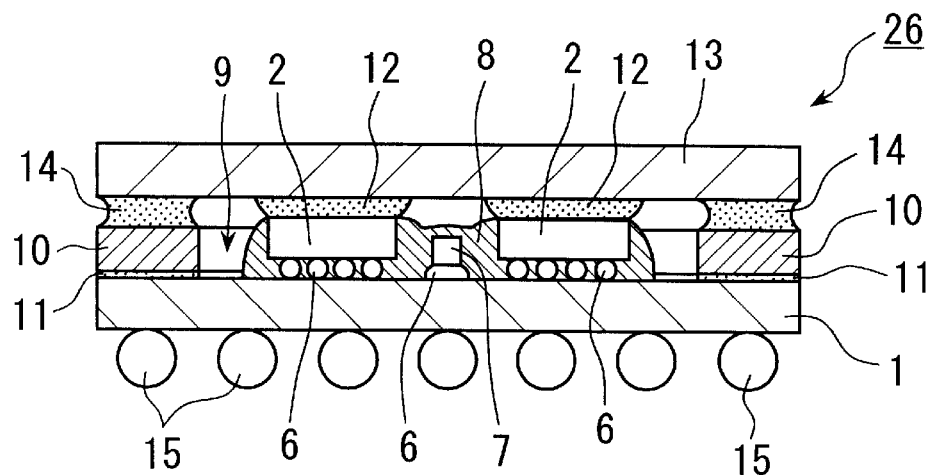
FIG. 6 is a cross sectional view illustrating a semiconductor device according to a second embodiment of the present invention.
Figure 7:
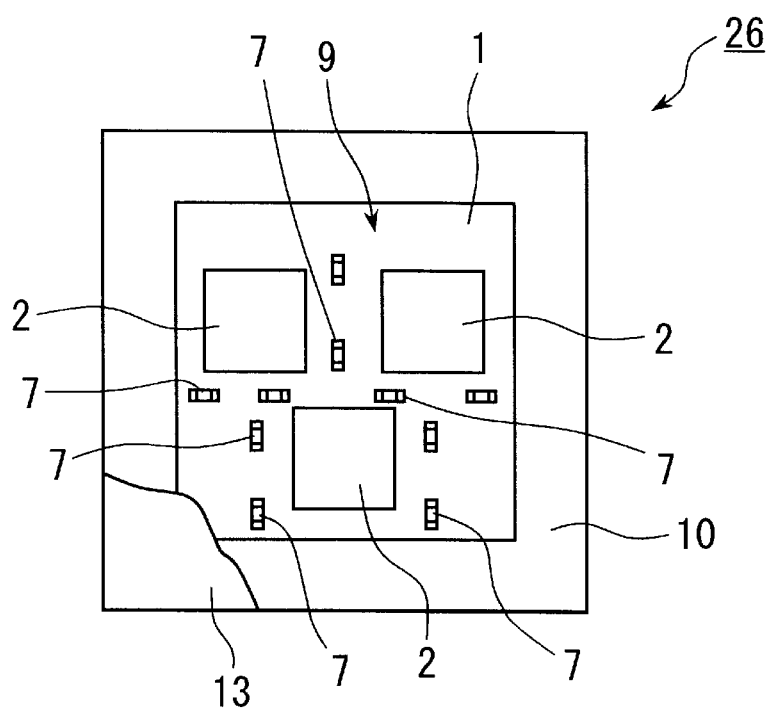
FIG. 7 is a partially cut away plan view illustrating the semiconductor device of FIG. 6, wherein a lid member, conductive adhesive resin and underfill resin are partially removed.

Next, an explanation will be made on a second embodiment of the present invention. FIG. 6 illustrates conceptually a cross section of a semiconductor device according to the second embodiment of the present invention. FIG. 7 is a partially cut away plan view illustrating the semiconductor device of FIG. 6, wherein underfill resin is removed for the sake of easy understanding of positional relation of components. Also, portions having the same structure as that of the corresponding portions of the first embodiment are designated by the same reference numerals and description thereof is omitted here.

A semiconductor device 26 of the second embodiment is a multi-chip module type semiconductor device, in which a plurality of semiconductor chips 2 are flip chip bonded or mounted on a substrate 1 and within a space 9 surrounded by the substrate 1, an auxiliary board 10 and a lid member 13. Corresponding to each semiconductor chip 2, for example, one or more chip components 7 are mounted on the substrate 1 by eutectic solder portions 6. Underfill resin 8 fills a portion between each of the plurality of semiconductor chips 2 and the substrate 1 and wholly covers the chip components 7. Structure of other portions of the semiconductor device 26 is the same as that of the corresponding portions of the semiconductor device 25 of the first embodiment.

Since the chip components 7 are wholly covered with the underfill resin 8 which is an insulator, electrodes or terminals of the chip components 7 do not contact the conductive adhesive resin 12. Thus, electrical short does not occur, via the conductive adhesive resin 12, between electrodes of one chip component 7, between electrodes of a plurality of chip components 7, between electrodes of the chip components 7 and conductive portions of the semiconductor chips 2, and so on. Also, the chip components 7 as well as the semiconductor chips 2 are coupled with the substrate 1 via eutectic solder portions 6 and are also mechanically fixed to the substrate 1 by the underfill resin 8. Therefore, coming away or dislocation of the chip components 7 from the substrate 1 does not occur in a solder reflow process to mount the semiconductor device 26 of this embodiment on, for example, another substrate.

Figure 8:
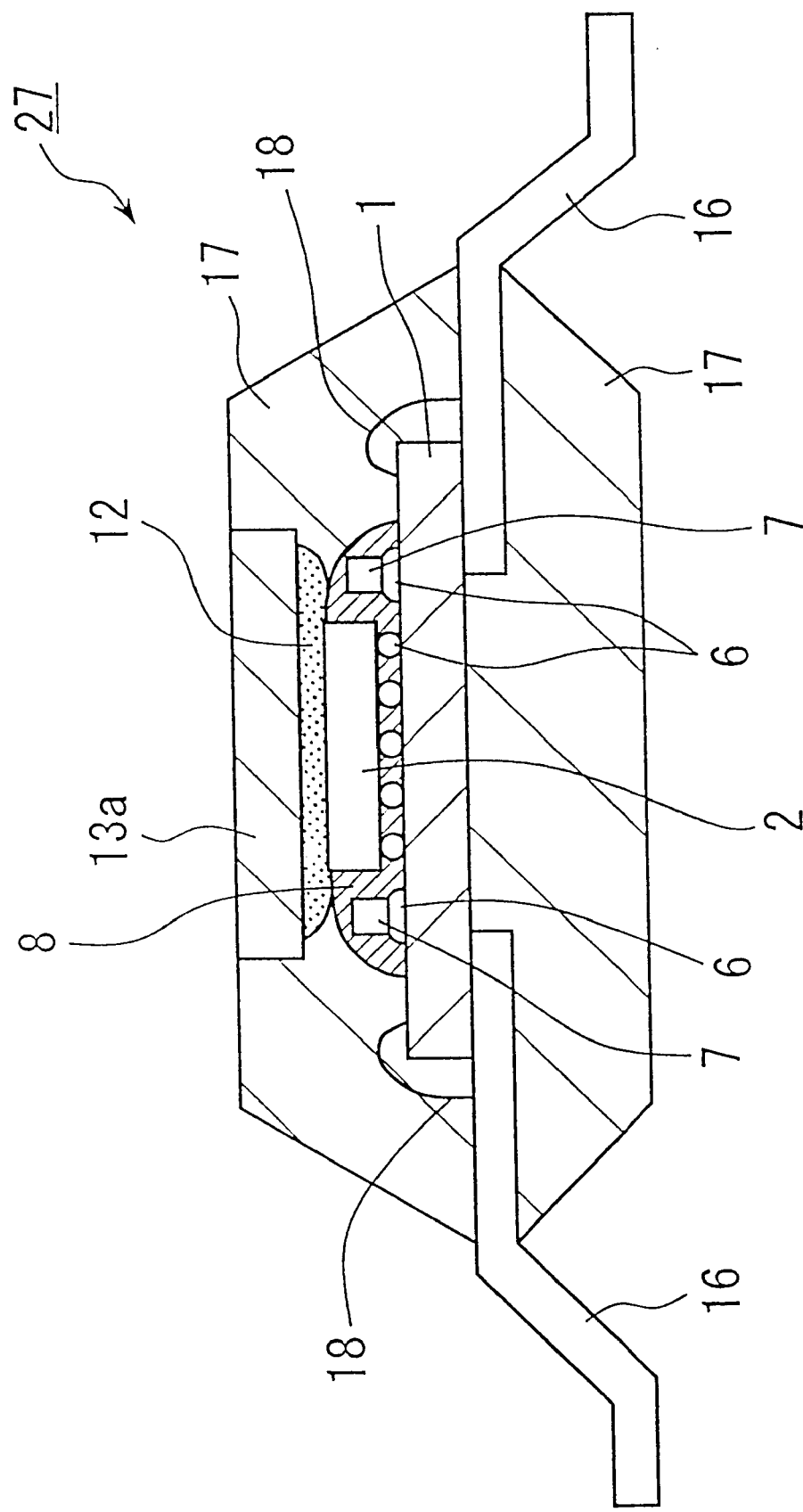
FIG. 8 is a cross sectional view illustrating a semiconductor device according to a third embodiment of the present invention.

An explanation will be made on a third embodiment of the present invention. FIG. 8 illustrates conceptually a cross section of a semiconductor device according to the third embodiment of the present invention. Portions having the same structure as that of the corresponding portions of the first embodiment are designated by the same reference numerals and description thereof is omitted here.

A semiconductor device 27 of the third embodiment is a molded type semiconductor device, and does not have a BGA package structure like that of the first embodiment. In the semiconductor device 27, similarly to the semiconductor device 25 of the first embodiment, a semiconductor chip 2 is flip chip mounted on a substrate 1. Near the semiconductor chip 2, one or more chip components 7 are mounted on the substrate 1. Underfill resin 8 fills a portion between the semiconductor chip 2 and the substrate 1 and wholly covers the chip components 7. A lid member 13a is bonded to the semiconductor chip 2 with conductive adhesive resin 12. On the surface opposite to the surface on which the semiconductor chip 2 and the chip components 7 are mounted, a metal lead frame 16 is attached. The lead frame 16 is electrically coupled with conductor patterns not shown in the drawing on the substrate 1 via bonding wires 18. Also, the substrate 1, the semiconductor chip 2, the chip components 7, the underfill resin 8 and the like are molded by a mold resin 17 such that these parts are wholly covered by the mold resin 17. In this case, the lid member 13a and the lead frame 16 are partially covered by the mold resin 17, that is, the upper surface of the lid member 13a are exposed and portions of the lead frame 16 are exposed and projected outside the mold resin 17. In this embodiment, the auxiliary board 10 and the solder balls 15 are not provided.

When the semiconductor device 27 according to this embodiment is to be attached to an external substrate and the like, portions of the lead frame 16 projecting outside the mold resin 17 are connected to the external substrate and the like, thereby electrical and mechanical coupling therebetween is performed.

Also in the semiconductor device 27 of this embodiment, since the chip components 7 are wholly covered with the underfill resin 8 which is an insulator, electrodes or terminals of the chip components 7 do not contact the conductive adhesive resin 12. Thus, electrical short does not occur, via the conductive adhesive resin 12, between electrodes of one chip component 7, between electrodes of a plurality of chip components 7, between electrodes of the chip components 7 and conductive portion of the semiconductor chip 2, and so on. Also, the chip components 7 as well as the semiconductor chip 2 are coupled with the substrate 1 via eutectic solder 6 and are mechanically fixed to the substrate 1 by the underfill resin 8. Therefore, coming away or dislocation of the chip components 7 form the substrate 1 does not occur in a solder reflow process to mount the semiconductor device 27 of this embodiment on, for example, another substrate.

Figure 9:
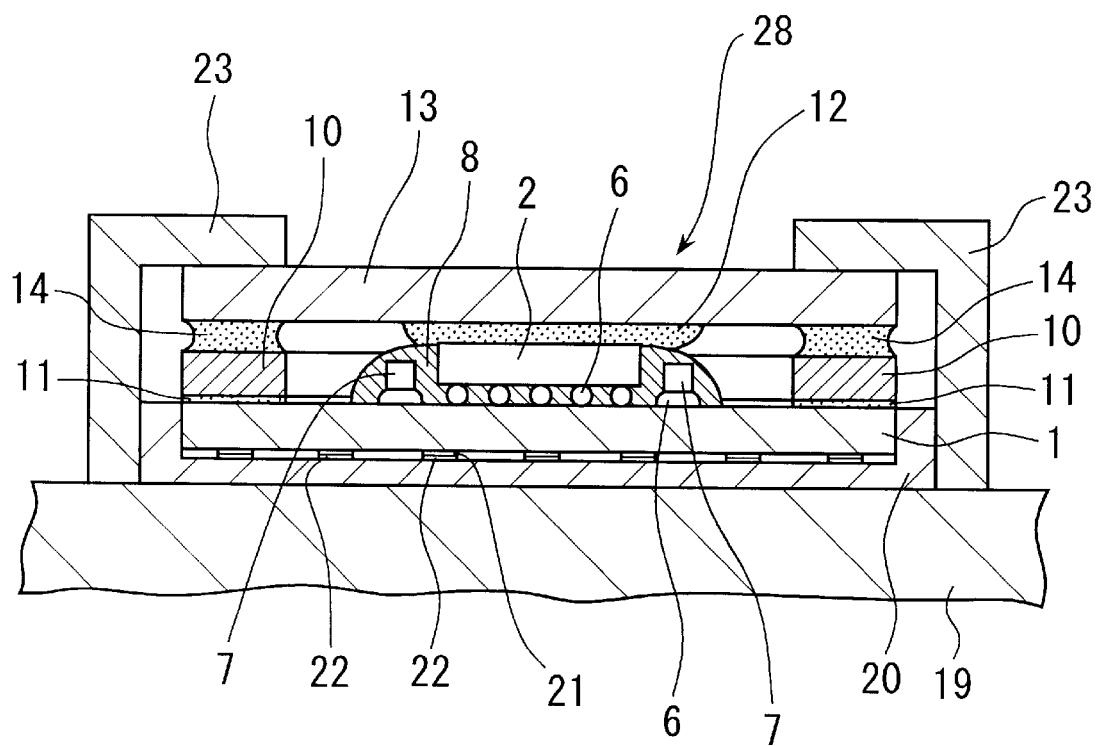
FIG. 9 is a cross sectional view illustrating a semiconductor device according to a fourth embodiment of the present invention.

Next, an explanation will be made on a fourth embodiment of the present invention. FIG. 9 illustrates conceptually a cross section of a semiconductor device according to the fourth embodiment of the present invention. Also, portions having the same structure as that of the corresponding portions of the first embodiment are designated by the same reference numerals and description thereof is omitted here.

A semiconductor device 28 of the fourth embodiment is a semiconductor device having a LGA (Land Grid Array) type package structure and does not have the BGA type package structure like that of the first embodiment. The semiconductor device 28 of this embodiment has substantially the same structure as that of the semiconductor device 25 of the first embodiment, except that, in place of the solder balls 15 of the first embodiment, pad like terminals 21 are provided on the surface of a substrate 1 opposite to the surface on which one or more semiconductor chips 2 and chip components 7 are mounted.

When the semiconductor device 28 is to be mounted on an external substrate 19, a socket 20 is provided on the external substrate 19, for example. The socket 20 has pad like terminals 22 corresponding to the pad like terminals 21 of the side of the substrate 1. The semiconductor device 28 is disposed on the socket 20 such that the pad like terminals 21 of the substrate 1 and the corresponding pad like terminals 22 of the socket 20 contact each other. In this condition, the semiconductor device 28 is pressed onto the socket 20 by a pressure member 23. Thereby, both pad like terminals 21 and 22 tightly contact each other, and the substrate 1 and the external substrate 19 are mutually secured. It should be noted that, as the pressure member 23, any type of pressure member can be used. Any structure and any way of pressurization of the pressure member 23 can be selected according to necessity.

In this embodiment, since the chip components 7 are wholly covered with the underfill resin 8 which is an insulator, electrodes or terminals of the chip components 7 do not contact the conductive adhesive resin 12. Thus, electrical short does not occur, via the conductive adhesive resin 12, between electrodes of one chip component 7, between electrodes of a plurality of chip components 7, between electrodes of the chip components 7 and conductive portions of the semiconductor chips 2, and so on.

Figure 10:
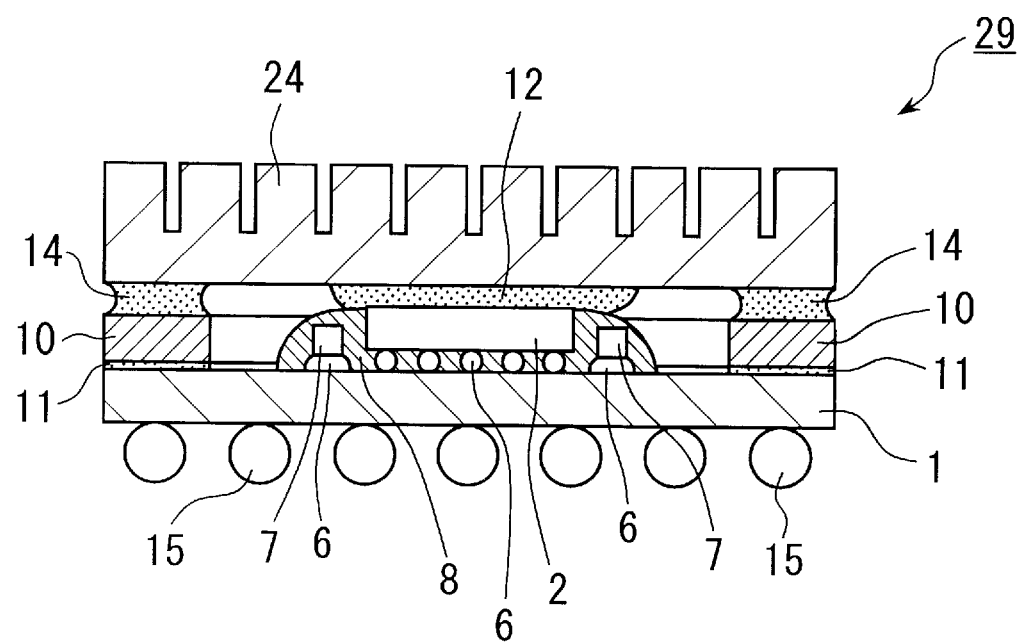
FIG. 10 is a cross sectional view illustrating a semiconductor device according to a fifth embodiment of the present invention.
Figure 11:
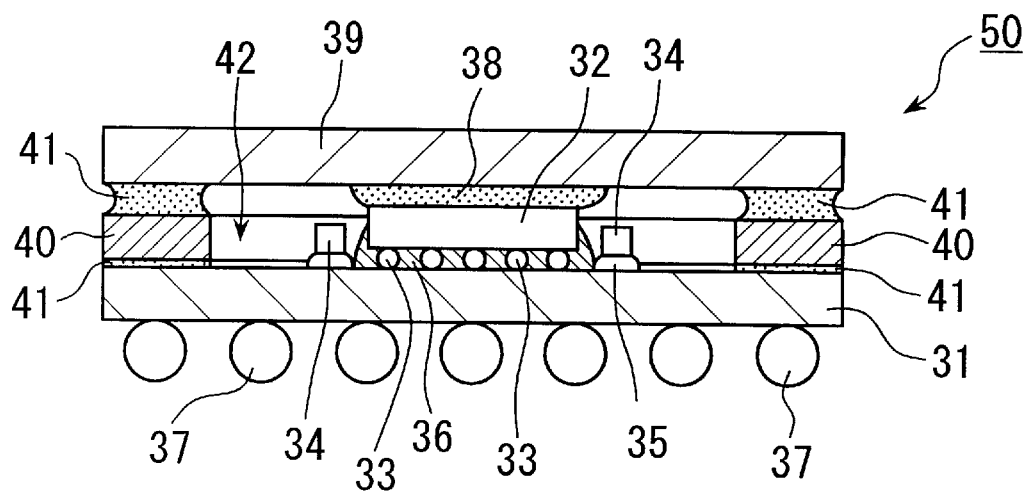
FIG. 11 is a conceptual cross sectional view illustrating an example of a conventional semiconductor device.
Figure 12:
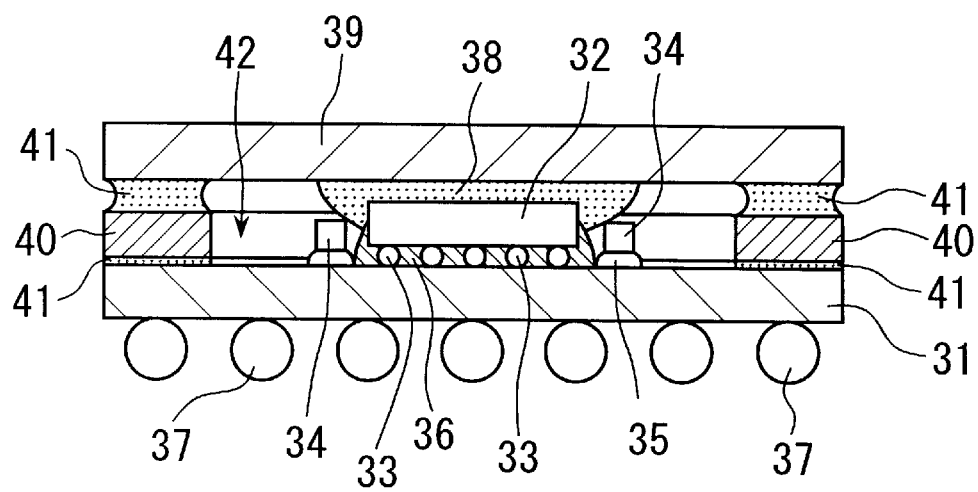
FIG. 12 is a cross sectional view illustrating a conventional situation caused when the quantity of conductive adhesive resin 38 is too large.

An explanation will be made on a fifth embodiment of the present invention. FIG. 10 illustrates conceptually a cross section of a semiconductor device 29 according to the fifth embodiment of the present invention. Also, portions having the same structure as that of the corresponding portions of the first embodiment are designated by the same reference numerals and description thereof is omitted here.

The semiconductor device 29 of this embodiment has substantially the same structure as that of the semiconductor device 25 of the first embodiment, except that, in place of the lid member 13 of the first embodiment, a lid member with heat dissipating fins 24 are used. The lid member with heat dissipating fins 24 is bonded to the upper surface of a semiconductor chip 2 via conductive adhesive resin 12 and bonded to the upper surface of an auxiliary board 10 via conductive adhesive resin 14. Therefore, the semiconductor device 29 of this embodiment has superior heat dissipating characteristics, in addition to the advantageous effects of the semiconductor device 25 of the first embodiment. It should be noted that, in each of other embodiments mentioned above, it is possible to use a lid member with heat dissipating fins as a lid member to obtain superior heat dissipating characteristics.

In summary, since the chip components are wholly covered with the underfill resin which is an insulator, electrodes or terminals of the chip components do not contact the conductive adhesive resin. Thus, electrical short does not occur, via the conductive adhesive resin, between electrodes of one chip component, between electrodes of a plurality of chip components, between electrodes of the chip components and conductive portion of the semiconductor chip, and so on. Therefore, the conductive adhesive resin does not give bad influence on the semiconductor device.

Also, the chip components as well as the semiconductor chips are strongly coupled with the substrate via eutectic solder and are mechanically fixed to the substrate by the underfill resin. Therefore, coming away or dislocation of the chip components form the substrate does not occur in a solder reflow process to mount the semiconductor device on, for example, another substrate.

Further, the lid member can be used as the ground terminal for grounding the semiconductor device. Also, when the conductive members are used as the lid member and the auxiliary board, the semiconductor chip and the chip components are electromagnetically shielded completely. Therefore, electromagnetic wave generated during operation of the semiconductor chip does not escape outside the semiconductor device and does not give bad influence on components and the like existing outside. Further, electromagnetic wave from external does not give bad influence on the operation of the semiconductor device.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A semiconductor device comprising:

a substrate;

one or more semiconductor chips each of which is flip chip bonded at a first surface thereof to said substrate;

at least one passive component mounted on said substrate and in the proximity of said semiconductor chips;

insulating underfill resin which covers the passive component and which fills at least part of a portion between said first surface of each of said one or more semiconductor chips and said substrate; and a lid member which is bonded to a second surface of each of said one or more semiconductor chips opposite to said first surface, via conductive adhesive resin.

2. A semiconductor device as set forth in claim 1, wherein said one or more semiconductor chips and said at least one passive component are electrically coupled with conductor pattern portions of said substrate via solder coupling portions, wherein said one or more semiconductor chips are fixed to said substrate by said underfill resin which fills between said first surface of each of said one or more semiconductor chips and said substrate except said solder coupling portions, and wherein said passive components are fixed to said substrate by said underfill resin covering said passive component.

3. A semiconductor device as set forth in claim 1, wherein at least part of said second surface of each of said one or more semiconductor chips is electrically conductive.

4. A semiconductor device as set forth in claim 1, further comprising an auxiliary board which intervenes between said substrate and said lid member.

5. A semiconductor device as set forth in claim 1, wherein said semiconductor device comprises a plurality of solder balls provided on a surface of said substrate opposite to a surface on which said one or more semiconductor chips and said passive component are mounted, and whereby said semiconductor device constitutes a BGA (Ball Grid Array) package structure.

6. A semiconductor device as set forth in claim 1, further comprising:
    a mold resin portion which molds at least a part of said lid member, said substrate, said one or more semiconductor chips, said passive component and said underfill resin; and
    a lead frame which is fixed with said substrate, which is electrically coupled with conductor pattern portions of said substrate, and a part of which projects outside said mold resin portion.

7. A semiconductor device as set forth in claim 1, wherein said semiconductor device comprises a plurality of pad terminals provided on a surface of said substrate opposite to a surface on which said one or more semiconductor chips and said passive component are mounted, and whereby said semiconductor device constitutes a LGA (Land Grid Array) package structure.

8. A semiconductor device as set forth in claim 1, wherein said lid member is a lid member with heat dissipating fins.

9. A semiconductor device as set forth in claim 4, wherein said auxiliary board surrounds a space including said one or more semiconductor chips and said passive component.

10. A semiconductor device as set forth in claim 9, wherein said lid member and said auxiliary board are both made of conductive material wherein said auxiliary board is bonded to said lid member by conductive adhesive resin, and wherein said one or more semiconductor chips and said passive component are electromagnetically shielded by said lid member and said auxiliary board.

* * * * *